United States Patent [19]

Elms

[11] Patent Number: 4,910,456
[45] Date of Patent: Mar. 20, 1990

[54] ELECTRONIC WATT-HOUR METER WITH COMBINED MULTIPLIER/INTEGRATOR CIRCUIT

[75] Inventor: Robert T. Elms, Monroeville, Pa.

[73] Assignee: ASEA Brown Boveri Inc., Purchase, N.Y.

[21] Appl. No.: 288,591

[22] Filed: Dec. 22, 1988

[51] Int. Cl.⁴ .............................................. G01R 11/32
[52] U.S. Cl. ..................................... 324/142; 324/111
[58] Field of Search ....................... 324/142, 130, 111; 364/842, 483; 328/160

[56] References Cited

U.S. PATENT DOCUMENTS

| | | | |
|---|---|---|---|
| 4,182,983 | 1/1980 | Heinrich et al. | 324/142 |
| 4,254,376 | 3/1981 | Steinmiller | 324/142 |
| 4,315,212 | 2/1982 | Gamoh | 324/142 |
| 4,356,446 | 10/1982 | Battocletti | 364/842 |
| 4,596,951 | 6/1986 | Heinrich et al. | 324/142 |
| 4,682,102 | 7/1987 | Milkovic | 324/142 |
| 4,733,131 | 3/1988 | Milkovic | 324/142 |

OTHER PUBLICATIONS

Ted W. Pickerrell, Interdesign, Inc. Designing Low Frequency Filters on the CMOS Monochip, Monochip Application Note APN-28, 1983, pp. 1, 2, 14.

Primary Examiner—Reinhard J. Eisenzopf
Assistant Examiner—Edward Urban
Attorney, Agent, or Firm—B. R. Studebaker

[57] ABSTRACT

An electronic watt-hour meter includes a multiplier/integrator circuit which performs "pulse height-pulse width" multiplication of current and voltage and simultaneously integrates the product of this multiplication to generate packets of electrical charge representative of the electrical energy consumed. A first set of switches alternately, at one-half the frequency of a pulse width modulated (PWM) signal having a duty cycle proportional to the current, connects one of a pair of capacitors to be charged by the voltage signal, and the other capacitor to dump charge into an accumulator. When charge in the accumulator reaches a preset value, a pulse is generated representing a predetermined unit of energy. When the first capacitor is connected to the voltage signal by the first set of switches, a second set of switches applies the voltage to the first capacitor in one sense when the PWM signal has one value and in the opposite sense when the PWM signal has a second value. Similarly, a third set of switches alternates the polarity in which the voltage signal is applied to the second capacitor as a function of the value of the PWM signal. The second and third sets of switches also determine the polarity of charge transferred to the accumulator from the first and second capacitors respectively in response to a polarity signal which indicates the direction of integration of charge by the accumulator.

7 Claims, 3 Drawing Sheets

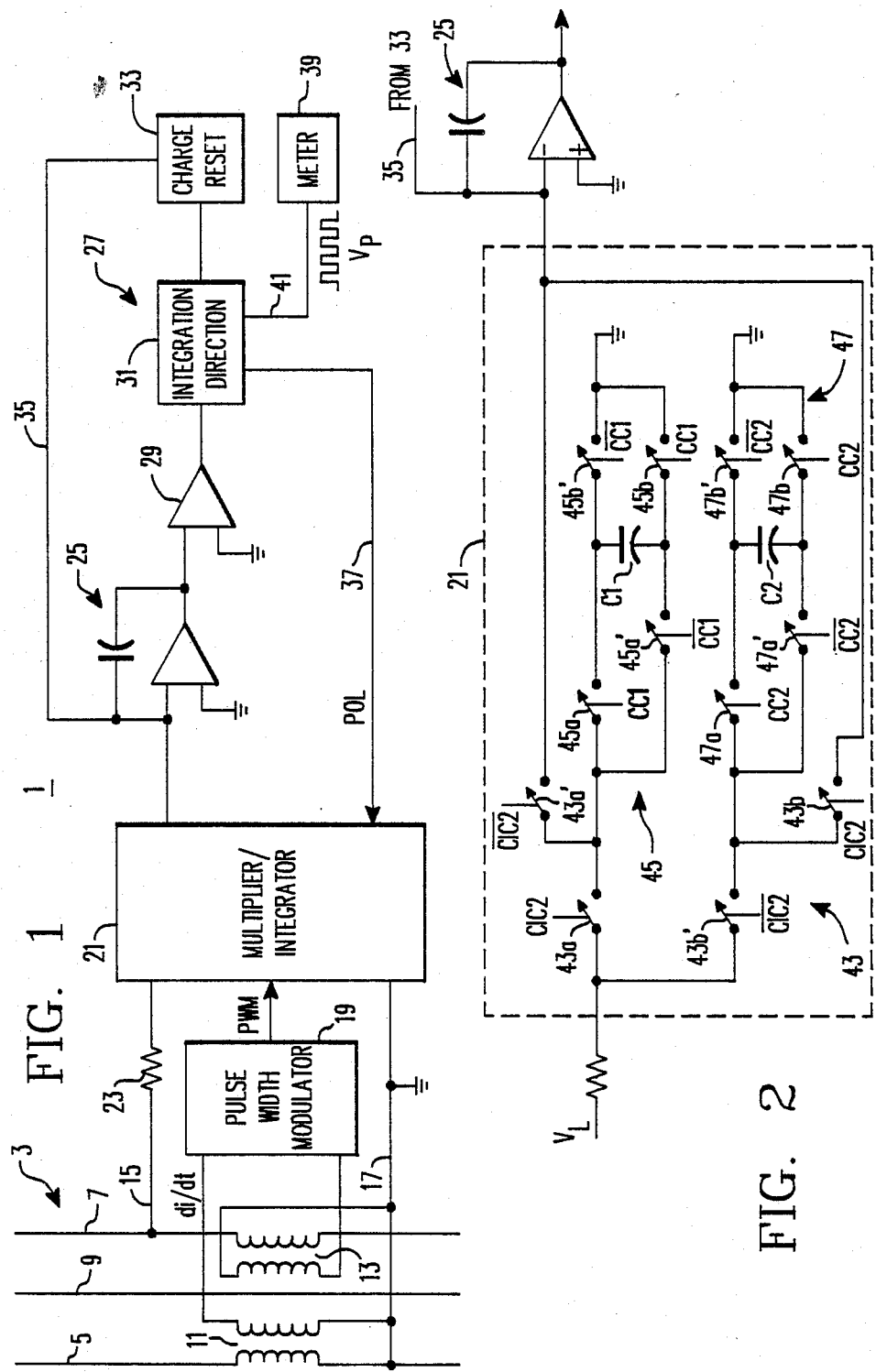

ELECTRONIC WATT-HOUR METER WITH COMBINED MULTIPLIER/INTEGRATOR CIRCUIT

BACKGROUND

1. Field of the Invention

This invention relates to electronic watt-hour meters in which electronic circuits multiply the current by the voltage and integrate the product to determine the electrical energy. More particularly, the invention relates to electronic circuits which combine the multiplication and integration functions in an electronic watt-hour meter.

2. Background of the Invention

Electronic circuits are known for measuring electrical energy. Typically, the current is multiplied by the voltage in a multiplication circuit. The product of this multiplication, which is the power, is then integrated by an integrating circuit to generate a quantity proportional to electrical energy. When the output of the integrator reaches a preset amount, a pulse is generated and the integrator is reset. Each output pulse therefor represents a predetermined unit of electrical energy. The output pulses are accumulated to record total energy consumption. It is common to have the integrator alternate the direction of integration on successive output pulses to reduce the effects of offset in the operational amplifier typically used in the integrator.

It is common to electronically perform the multiplication function by generating a pulse width modulated signal modulated by either the load current or voltage. This pulse width modulated signal, having a duty cycle proportional to the magnitude of the modulating parameter, is used to gate a voltage signal proportional to the other load parameter to the integrator. Positive values of this voltage signal are gated to the integrator when the pulse width modulated signal has one polarity, and negative values of the voltage signal are gated to the integrator for the other polarity of the pulse width modulated signal. The difference in the charge supplied to the integrator for the two polarities of the pulse width modulated signal represents the energy.

U.S. Pat. No. 4,596,951 discloses such an electronic watt-hour meter. In this patent, a mutual inductance current transducer is used to provide a signal proportional to di/dt, the time derivative of the metered circuit current. This di/dt signal is summed with a square wave clock signal and applied to an integrator. The output of the integrator is applied to a comparator which generates the pulse width modulated signal having a duty cycle proportional to the level of the current. The two signals of opposite polarity proportional to the voltage are generated in the secondary winding of a potential transformer. This arrangement requires that the potential transformer be exactly balanced, otherwise an ac ripple is present in the output. It also requires two matched resistors for converting the voltage signals to currents. Again, imbalance in these resistors will cause errors in the output.

U.S. Pat. No. 4,682,102 discloses a solid state watt-hour meter with switched capacitor integration. This meter has separate multiplication and integration circuits, however, the input resistor to the integrator is replaced by switched capacitors. The purpose of using switch capacitor integration is to eliminate the need for resistors and capacitors of high accuracy in the integrator so that the entire watt-hour meter may be implemented on an integrated circuit chip. It is recognized that the accuracy in the switched capacitor integration is related to the ratio of the capacitances in the integrator and not their absolute value, and to the magnitude of a reference voltage and the accuracy of the clock signal.

There remains a need, however, for an electronic watt-hour meter which does not require opposite polarity voltage sources and does not require matched components.

It is another object of the invention to provide an electronic watt-hour meter with reduced circuitry.

It is yet another object of the invention to provide an electronic watt-hour meter in which the multiplication and integration are carried out by the same components.

It is an overall object of the invention to provide an electronic watt-hour meter in accordance with the above objects, which has high reliability and is economical to produce.

It is another object of the invention to provide such as electronic watt-hour meter which may be implemented on integrated circuit chips.

SUMMARY OF THE INVENTION

These and other objects are realized by the invention which is directed to an electronic watt-hour meter for measuring electrical energy in which the integration process is moved into the multiplier circuitry, and the charge transfer techniques of switched capacitor circuits are used to accumulate packets of charge proportional to the energy.

More particularly, the electronic watt-hour meter of the invention includes a multiplier/integrator circuit which multiplies a pulse width modulated signal, modulated by one of the load current and load voltage, by an analog signal proportional to the other of the load current and load voltage, and simultaneously integrates the product of this multiplication to generate incremental packets of electrical charge proportional to the electrical energy. The electronic watt-hour meter of the invention further includes a means of accumulating the packets of electrical charge generated by the multiplier/integrator circuit, and means for generating a pulse signal having a frequency proportional to the rate at which electrical charge accumulates in the charge accumulating means and, hence, proportional to the electrical energy.

The multiplier/integrator circuit comprises a pair of capacitors and switching means which alternately, for successive full cycles of the pulse width modulated signal, apply the analog signal to one capacitor while connecting the other capacitor to transfer charge therein to the charge accumulation means, and at the same time to alternately, for the one capacitor, apply the analog signal to the one capacitor in one sense for one level of the pulse width modulated signal and applying the analog signal to the capacitor in the opposite sense in response to the other level of the pulse width modulated signal. Thus, the packets of charge generated in the capacitors of the multiplier/integrator circuit represent the time integrated product of the voltage and current, which is the electrical energy consumed in the metered circuit.

In the preferred embodiment of the invention, the accumulating means integrates charge transferred from the two capacitors, first in one direction and then the other between preset limits to eliminate the effects of offset in the accumulating means. A polarity single switches between first and second values as the accumulation means reaches these limits. The switching means is responsive to the polarity signal to connect the other capacitor to the accumulating means with alternating polarity dependent upon the level of the polarity signal. The switching means is operated by non-overlapping clock signals to isolate the capacitors between switched states.

Preferably, the switching means includes a first set of switches to alternately connect one capacitor to the analog signal and the other to the accumulating means. A second set of switches alternately connects the first capacitor in one sense and then the other, while a third set of switches similarly connects the second capacitor alternately in one sense and then the other. A first control signal switches the first set of switches at one-half the frequency of the pulse width modulated signal. Second and third control signals control the second and third sets of switches respectively so that when the associated capacitor is connected to the analog signal, the capacitor is alternately connected to be charged in one sense when the pulse width modulated signal has one level and in the opposite sense when the pulse width modulated signal is at its other digital level. The second and third control signals also control the second and third set of switches so that when the associated capacitor is connected to transfer charge to the charge accumulation means, the capacitor is connected to transfer charge of one polarity when the polarity signal is at one level, and to transfer charge of the opposite sense when the polarity signal is at its other level.

The invention provides an electronic watt-hour meter in which the multiplication of current and voltage and the integration of the product are carried out simultaneously in a multiplier/integrator circuit. The arrangement eliminates the need for a potential transformer to generate voltage signals of opposite polarity and also the need for matched resistors. Since charge is transferred, it is not necessary to have closely matched components and the switching provides for the transfer of charge with alternating polarity.

BRIEF DESCRIPTION OF THE DRAWINGS

A full understanding of the invention can be gained from the following description of the preferred embodiment when read in conjunction with the accompanying drawings in which:

FIG. 1 is a schematic circuit diagram of an electronic watt-hour meter in accordance with the invention.

FIG. 2 is a simplified schematic circuit diagram of a multiplier/integrator circuit which forms a part of the electronic watt-hour meter of FIG. 1.

DESCRIPTION OF THE PREFERRED EMBODIMENT

Figure 3:
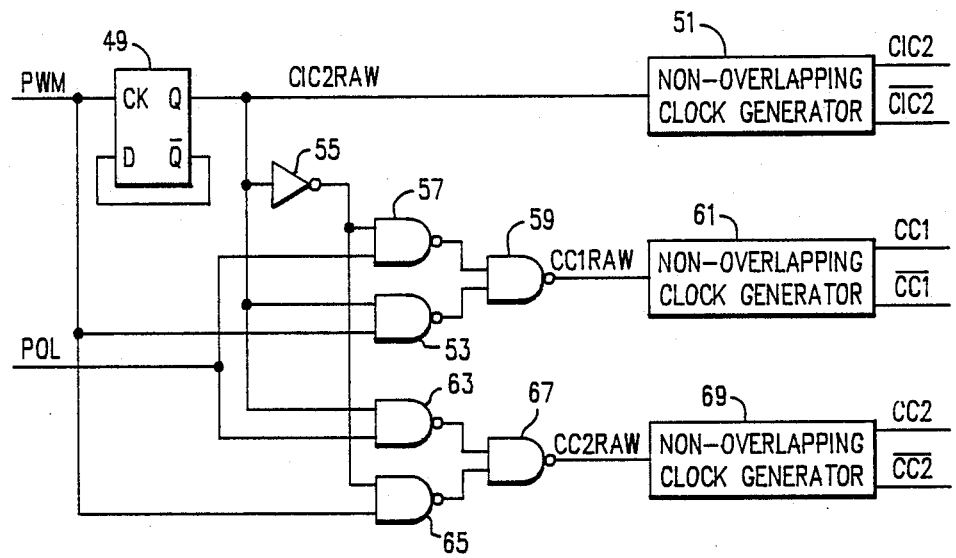
FIG. 3 is a schematic circuit diagram of a portion of the multiplier/integrator circuit which generates control signals for the switches shown in the circuit of FIG. 2.

FIG. 1 illustrates a schematic circuit diagram, partially in block diagram form, of an electronic watt-hour meter 1 incorporating the principals of the invention. The meter 1 is connected to measure the electrical energy consumed by an electric distribution circuit 3 which includes two line conductors 5 and 7 and a neutral line 9.

The circuit 3 may represent a conventional electric power distribution circuit having a network frequency of 60 hertz, and a typical maximum line current value of 200 amperes. The voltage on the circuit 3 typically has RMS values of 120 volts between each of the line conductors 5 and 7 and the neutral conductor 9 and 240 volts between the line conductors 5 and 7.

A pair of mutual inductance current transducers 11 and 13 are connected in series with the line conductors 5 and 7, respectively. Transducers 11 and 13 provide an output signal, di/dt, that is proportional to the time derivative of the current flow, i, in the conductors 5 and 7. A transducer capable of producing such an output is disclosed in U.S. Pat. No. 4,368,424 issued to R. C. Miller.

Lead 15 connected to the conductor 7 and lead 17 connected to conductor 5 provide line to line voltage, $V_L$. The potential on the conductor 5 is utilized as system ground.

The output signals from the current transducers 11 and 13 are provided to a pulse width modulator circuit 19 where the two current derivative voltages are combined and used to produce a pulse width modulated output signal, the duty cycle of which is proportional to the line current on the electrical distribution system 3. A suitable circuit for the pulse width modulator 19 is disclosed in U.S. Pat. No. 4,596,951 issued to T. M. Heinrich and R. W. McKinsey.

The pulse width modulator (PWM) output signal from the circuit 19 is provided to a multiplier/integrator circuit 21. The line voltage signal, $V_L$, which is converted to an analog current signal by the resistor 23, is also applied to the multiplier/integrator circuit 21.

The multiplier/integrator circuit 21 simultaneously performs a "pulse height-pulse width" multiplication of the PWM signal and analog signal and simultaneously integrates the product of that multiplication to obtain kilowatt-hours or energy. The charge transfer techniques of "switched capacitor" circuits are used to transfer discrete packets of charge representative of energy from the multiplier/integrator circuit 21 to an accumulator 25. The accumulator 25 is a conventional integrator which accumulates the discrete packets of charge generated by the multiplier/integrator circuit 21. This accumulation of charge is converted to a pulse signal by pulse generating means 27 which include a comparator 29, an integration direction circuit 31 and a charge reset circuit 33. The charge reset circuit 33 alternately supplies a precise positive or negative charge to the integrator 25 through lead 35. The integrator 25 then integrates down to zero charge by accumulating the packets of charge transferred by the multiplier/integrator 21. When the charge on the integrator 25 reaches zero, the comparator 29 generates a pulse which is applied to the integration direction circuit 31. The integration direction circuit 31 determines the direction in which the integrator 25 is set to integrate and sends a signal to the charge reset circuit 33 indicating the limit to which the integrator 25 is to be reset. The integration direction circuit 27 also sends a polarity signal, POL, having one of two discrete signal levels to the multiplier integrator 21 indicating the sense or polarity for the packets of electrical charge to be applied to the integrator 25. The integration direction circuit also generates output pulses which are provided to a meter 39 over lead 41. A pulse is generated in the output signal $V_p$ each time the output of the accumulating means 25 reaches zero. Thus, each pulse in the signal $V_p$ represents a unit of energy consumed in the electric distribution circuit 3. The accumulating means 25 accumulates charge alternately in both directions to reduce the effects of offset as is done in known electronic kilowatt-hours meters where an integrator similar to 25 integrates the $I \times V$ product of a separate multiplier circuit.

The meter 39 may be any one of the well known devices for accumulating or totalizing the pulses in the signal $V_p$ to provide an indication of the total watt-hour consumption of the electrical distribution system 3.

FIG. 2 is a simplified schematic diagram of the multiplier/integrator circuit 21. Circuit 21 includes a pair of capacitors C1 and C2. A first set of switches 43 alternately applies the analog signal $V_L$ to one of the capacitors C1 or C2, and connects the other capacitor to the accumulator 25. The switch 43a associated with the capacitor C1 and the switch 43b associated with a capacitor C2 are operated together by a control signal, C1C2. Thus, with these switches closed, the analog signal is applied to the capacitor C1 and the capacitor C2 is connected to the accumulator 25. Similarly, the switches 43a' associated with the capacitor C1 and the switch 43b' associated with C2 are operated by a common control signal $\overline{C1C2}$ to alternately apply the analog signal to capacitor C2 and connect the capacitor C1 to the accumulator 25. A second set of switches 45 includes switch 45a and 45b, both controlled by the control signal CC1 which connect the capacitor C1 in one sense or polarity between system ground and the switches 43a and 43a' of the first set of switches. The second set of switches also includes the switches 45a' and 45b' alternately connect the capacitors C1 between system round and the switches of the first set in the opposite sense.

In like manner, a third set of switches 47 includes switches 47a and 47b which connect the capacitor C2 between system ground and the first set of switches 43 in one sense and the switches 47a' and 47b' which connect capacitor C2 in the opposite sense. The switches 47a and 47b are operated together by a control signal CC2 while the switches 47a' and 47b' are operated by the common control signal $\overline{CC2}$.

The circuits for generating the control signals which operate the three sets of switches 43, 45 and 47, and which form part of the multiplier/integrator circuit 21 are shown in FIG. 3. The pulse width modulated signal (PWM) is applied to a flip-flop 49 which divides by two to produce a pulse signal C1C2 RAW having a frequency equal to one-half the frequency of the signal PWM. In order to isolate the capacitors C1 and C2 during switching operations, the signal C1C2 RAW is applied to a non-overlapping clock generator circuit 51 which produces the first set of control signals C1C2 and $\overline{C1C2}$. As will be seen below, the signals C1C2 and $\overline{C1C2}$, are not exactly complimentary. The signal C1C2 RAW is applied together with the PWM to a NAND gate 53 and is an inverted by inverter 55 and applied together with POL signal to another NAND circuit 57.

The outputs of NANDS 53 and 57 are applied to a third NAND 59 which generate a signal CC1 RAW. A non-overlapping clock generator 61, similar to the circuit 51, produces a second set of control signals CC1 and $\overline{CC1}$ from the CC1 RAW signal.

The third set of control signals is generated by applying the C1C2 RAW signal together with the POL signal to a NAND 63 and applying the inverted C1C2 RAW signal together with the PWM signal, to another NAND circuit 65. The outputs of NANDS 63 and 65 are applied to the NAND 67 which generates a signal CC2 RAW. The non-overlapping clock generator 69 generates the third control signals CC2 and $\overline{CC2}$ from the signal CC2 RAW.

Figure 4:
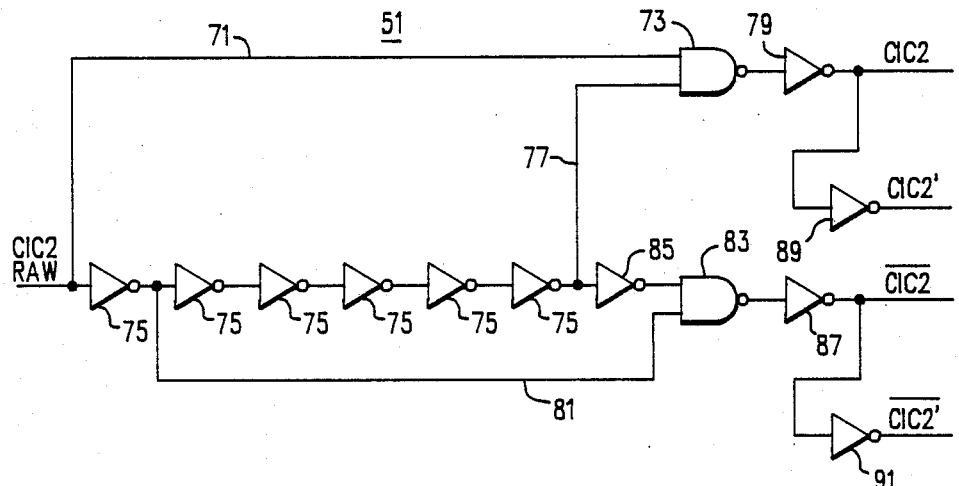
FIG. 4 is a schematic circuit diagram of the details of a suitable non-overlapping clock generator which forms a part of the control signal generating circuits of FIG. 3.

A known exemplary circuit for the non-overlapping clock generator 51 is shown in FIG. 4. Identical circuits are provided for the non-overlapping clock generators 61 and 69. The signal C1C2 RAW is applied over lead 71 to a NAND circuit 73. C1C2 RAW is also applied to an even number of inverter circuits 75 so that the signal appearing on lead 77, and applied to NAND 73, is the signal C1C2 RAW delayed by the total propagation time through the six inverters 75. This delay time is on the order of ten nanoseconds. The output of NAND 73 is inverted by inverter 79 to generate the signal C1C2. It can be seen from the circuit 51 that when C1C2 RAW goes high, C1C2 is delayed in going high by the delay time of the string of inverters 75. On the other hand, when C1C2 RAW goes low, C1C2 goes low essentially simultaneously.

C1C2 RAW inverted by the first inverter 75 is applied through lead 81 to a NAND 83. The same signal, delayed by passing through five inverters 75 and an inverter 85, is also applied to NAND 83. The output of NAND 83 is inverted by inverter 87 to produce the signal $\overline{C1C2}$. Inverters 89 and 91 generate the signals C1C2' and $\overline{C1C2}'$ respectively, which are the compliments of the signals C1C2 and $\overline{C1C2}$. These complimentary signals are required because the switches 43, 45, and 47 are CMOS, transmission gates which require complimentary signals for bipolar operation.

Figure 5:
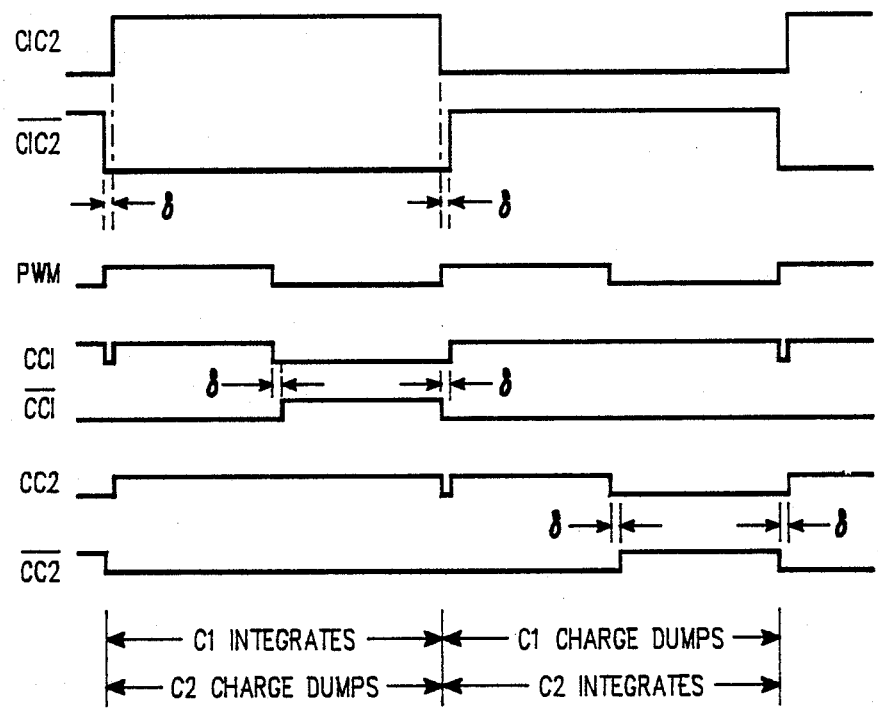
FIG. 5 is a diagram illustrating waveforms generated during operation of the circuits of FIG. 3 when the accumulating means is accumulating charge of a first polarity.

As can be seen from the waveform diagrams of FIG. 5, the signal C1C2 and $\overline{C1C2}$ are not strictly complimentary since $\overline{C1C2}$ goes low as soon as C1C2 RAW goes high while C1C2 is delayed in going high by an increment of time δ. Similarly, C1C2 goes low before $\overline{C1C2}$ goes high by the same interval, δ. Thus the signals C1C2 and $\overline{C1C2}$ are non-overlapping. That is, they are never both high at the same instant. With the signal C1C2 high and $\overline{C1C2}$ low, the switches 43a and 43b are closed and 43a' and 43b' are open so that the analog signal is applied to capacitor C1 and capacitor C2 is connected to the accumulator 25. When C1C2 goes low, the switches 43a and 43b open to disconnect the capacitors C1 and C2 from the analog signal and accumulator 25 respectively, before the switches 43a' and 43b' close to connect capacitor C1 to the accumulator 25 and to apply the analog signal to the capacitor C2.

It can be seen from FIG. 5 that the frequency of the signals C1C2 and $\overline{C1C2}$ is essentially one-half the frequency of the pulse width modulated signal (PWM).

FIG. 5 also illustrates the waveforms for the second control signals CC1, $\overline{CC1}$ and third control signals CC2, $\overline{CC2}$, generated when the polarity signal, POL, is high. It will be noticed that the non-overlapping clock generator 61 generates a notch in CC1 which is high at the time that C1C2 goes high so that the capacitor C1 is isolated while the first set of switches 43 disconnects the capacitor from the analog signal and connects it to the accumulator 25. With the signal CC1 high and $\overline{CC1}$ low, the switches 45a and 45b re closed while the switches 45a' and 45b' are both open to connect the capacitor C1 between the switches 43 and system ground in a first sense or polarity. When CC1 goes low with the change in level of the PWM signal, the switches 45a and 45b open. The switches 45a' and 45b' are then closed after the delay, δ, when the signal $\overline{CC1}$ goes high to connect the capacitor C1 in the opposite sense or polarity.

Thus, while the capacitor C1 remains connected to the analog signal for a full cycle of the PWM signal, it is connected to store charge in one sense when the PWM signal has one level, and in the opposite sense when the PWM signal is at its other level. Applying the analog signal to the capacitor C1 alternately in one sense, for one value of the pulse width modulated signal and then in the opposite sense for the other level of the pulse width modulated signal, performs pulse height-pulse width multiplication of the voltage represented by the analog signal, by the current, which determines the duty cycle of the pulse width modulated signal, and storing the differential charge on the capacitor C1 performs the integration function. Hence, the multiplication and integration functions are simultaneously performed by the multiplier/integrator circuit 21.

When the signal C1C2 goes low to disconnect the capacitor C1 from the analog signal and the signal $\overline{C1C2}$ goes high to close the switch 43a', CC1 goes high to close switches 45a and 45b to transfer charge from the capacitor C1 to the accumulator 25 in the first sense. This can be seen from the CC1 waveform in FIG. 5. Capacitor C1 remains connected to the accumulating means 25 in the same sense for the entire time that the switch 43a' is closed.

It can be appreciated then that the capacitor C1 alternates between storing packets of electrical charge representative of the electrical energy consumed in the electric circuit and dumping those packets of charge into the charge accumulator 25.

It can be seen from FIGS. 2 and 5 that a second control signal CC2 and $\overline{CC2}$ control C2 in a similar but opposite manner so that while C1 is storing packets of electrical energy through simultaneous multiplication and integration of the current and voltage, capacitor C2 is transferring stored charge to the accumulating means 25. Similarly, C2 stores packets of energy produced by the simultaneous multiplication/integration of the voltage and current while C1 is transferring charge to the accumulating means 25.

Figure 6:
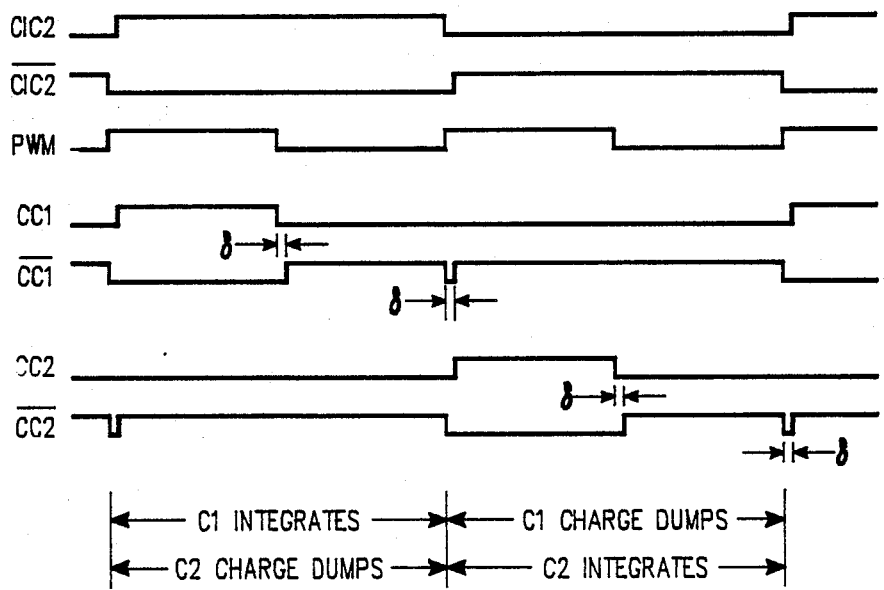
FIG. 6 is a diagram of the waveforms generated during operating of the circuits of FIG. 3 when the accumulating means is accumulating charge of the opposite polarity.

FIG. 6 illustrates the waveforms of the control signals when the polarity signal is zero. It can be seen from these waveforms that when $\overline{C1C2}$ is high to close switch 43a' and transfer charge to the accumulating means 25, $\overline{CC1}$ is also high so that charge is transferred from the capacitor C1 to the accumulating means 25 in the opposite sense from when the POL signal was high. It can also be seen from FIG. 6 that with the POL signal low and C1C2 high to close 43b that switches 47a' and 47b' are closed by signal $\overline{CC2}$ to dump charge into the accumulating means 25 in the opposite sense from when the POL was high.

It can be appreciated, therefore, that the polarity of the charge accumulated in the accumulator 25 alternates with the polarity of the signal POL. The charge reset circuit 33 sets the charge in the accumulator means to a positive or negative limit determined by the integration direction circuit 31. The capacitor C1 and C2 then alternately transfer packets of charge to the accumulator in a sense controlled by the POL signal which causes the accumulator means 25 to integrate toward zero. When zero is reached, the charge reset circuit 33 resets the preset charge on the accumulator 25 to the other limit and charge from C1 and C2 is again accumulated which causes accumulator 25 to again integrate toward zero. Each time the charge on accumulator 25 reaches zero, a pulse is generated in the output signal $V_p$, which is applied to the meter 39.

What is claimed is:

1. An electronic watt-hour meter for measuring electrical energy comprising:
   means generating a pulse width modulation signal modulated by one of a load current and load voltage and alternately having two signal levels;
   means generating an analog current signal proportional to the other of said load current and load voltage;
   a multiplier/integrator circuit multiplying said analog current signal by said pulse width modulation signal and simultaneously integrating a product of such multiplication to generate packets of electrical charge proportional to electrical energy;
   means accumulating said packets of electrical charge generated by the multiplier/integrator circuit; and
   means generating a pulse signal having a frequency proportional to the rate at which electrical charge accumulates in said charge accumulating means and hence proportional to the electrical energy.

2. The meter of claim 1 wherein said multiplier integrator circuit comprises pair of capacitors, and switching means applying alternately during successive full cycles of said pulse width modulation signal, said analog current signal to one capacitor while connecting the other capacitor to transfer charge therein to said charge accumulating means and in addition, to alternately for said one capacitor applying said analog current signal to said one capacitor in one sense for one level of the pulse width modulation signal and applying said analog current signal to said one capacitor in the opposite sense in response to the other level of the pulse width modulation signal.

3. The electronic watt-hour meter of claim 2 wherein said switching means include means generating non-overlapping clock signals and wherein said switching means are operated by said non-overlapping clock signals to isolate said capacitors between switched states.

4. The electronic watt-hour meter of claim 2 including:
   means generating a polarity signal alternately having a first value and a second value and switching said polarity signal between said first and second values as the accumulated charge in said charge accumulating means reaches preset limits, and wherein said switching means is responsive to said polarity signal to connect said other capacitor to said accumulating means to transfer charge in said other capacitor to the accumulating means in the first sense when the polarity signal has a first value and in the opposite sense when said polarity signal has the second value.

5. The electronic watt-hour meter of claim 4 wherein said switching means include means generating non-overlapping clock signals and wherein said switching means are operated by said non-overlapping clock signals to isolate said capacitors between switched states.

6. The electronic watt-hour meter of claim 1 wherein said multiplier/integrator comprises:
a first capacitor;
a second capacitor;
a first set of switches responsive to a first control signal for alternately applying said analog current signal to one and then the other of said first and second capacitors to store charge therein representative of the integral of the product of the load current and load voltage while connecting the other and then said one of said first and second capacitors to transfer charge stored therein to said charge accumulating means;
a second set of switches responsive to a second control signal for alternating the sense in which the first capacitor is connected between system ground and said first set of switches;
a third set of switches responsive to a third control signal for alternating the sense in which the second capacitor is connected between system ground and said first set of switches;
means generating said first control signal having a frequency of twice the frequency of the pulse width modulation signal;
means generating said second control signal to control said second set of switches to alternate, in response to the first and second levels of said pulse width modulation signal, the sense in which the first capacitor is connected by the second set of switches when said first capacitor is connected by said first set of switches to said analog signal; and
means generating said third control signal which controls said third set of switches to alternate, in response to the first and second levels of said pulse width modulation signal, the sense in which the second capacitor is connected by the third set of switches when said second capacitor is connected by said first set of switches to said analog signal.

7. The electronic watt-hour meter of claim 6 wherein said means generating a pulse signal includes means alternately resetting said accumulating means to accumulate charge of one polarity and then the other polarity each time the accumulated charge reaches preset limits, and means generating a polarity signal set to a first value when said accumulating means is set to accumulate charge of the one polarity and set to a second value when said accumulating means is set to accumulate charge of the other polarity, and wherein said means generating said second control signal is responsive, when the first set of switches connects the first capacitor to said accumulating means, to generate a second control signal which operates said second set of switches to connect the first capacitor to transfer charge of said one polarity to the charge accumulating means when the polarity signal has first value and to transfer charge to the charge accumulating means of the other polarity when the polarity signal has said second value, and wherein said means generating said third control signal is responsive to said polarity signal when the first set of switches connects the second capacitor to the charge accumulating means, to generate a third control signal which operates the third set of switches to connect the second capacitor to transfer charge of said one polarity to the charge accumulating means when said polarity signal has said first value and to transfer charge of the other polarity to said charge accumulating means when said polarity signal has said second value.

* * * * *